(12) United States Patent
Prakash et al.

(10) Patent No.: US 8,350,238 B2
(45) Date of Patent: Jan. 8, 2013

(54) DEVICE PATTERNING USING IRRADIATION

(75) Inventors: Shiva Prakash, Santa Barbara, CA (US); Nugent Troung, Ventura, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 996 days.

(21) Appl. No.: 11/722,128

(22) PCT Filed: Dec. 29, 2005

(86) PCT No.: PCT/US2005/047280
§ 371 (c)(1),
(2), (4) Date: Mar. 27, 2008

(87) PCT Pub. No.: WO2006/078427
PCT Pub. Date: Jul. 27, 2006

(65) Prior Publication Data
US 2009/0039290 A1   Feb. 12, 2009

Related U.S. Application Data

(60) Provisional application No. 60/640,600, filed on Dec. 30, 2004, provisional application No. 60/694,394, filed on Jun. 27, 2005.

(51) Int. Cl.
*A61N 5/06* (2006.01)
*G01J 3/10* (2006.01)
*H05G 2/00* (2006.01)

(52) U.S. Cl. ............ 250/504 R; 250/492.1; 250/492.22; 428/469; 156/150; 156/151; 313/504; 313/506; 257/40; 257/72; 257/88

(58) Field of Classification Search ............... 250/492.1, 250/504 R, 492.22; 428/469; 156/150, 151; 313/504, 506; 257/40, 72, 88
See application file for complete search history.

(56) References Cited

U.S. PATENT DOCUMENTS

| | | | |
|---|---|---|---|
| 5,447,824 A | 9/1995 | Mutsaers | |
| 5,550,066 A | 8/1996 | Tang et al. | |
| 5,561,030 A | 10/1996 | Holdcroft et al. | ............. 430/311 |
| 5,620,800 A * | 4/1997 | De Leeuw et al. | ............. 428/469 |
| 5,953,585 A | 9/1999 | Miyaguchi | ....................... 438/35 |
| 6,045,977 A | 4/2000 | Chandross et al. | ........... 430/311 |
| 6,060,728 A | 5/2000 | Ghosh et al. | |
| 6,091,196 A | 7/2000 | Codama | ....................... 313/504 |
| 6,106,352 A | 8/2000 | Fujii | |
| 6,153,254 A | 11/2000 | Young et al. | |

(Continued)

FOREIGN PATENT DOCUMENTS
CA    2 291 302    5/2001
(Continued)

OTHER PUBLICATIONS

Campbell, I. H. et al., "Excitation Transfer Processes in a Phosphor-Doped Poly (p-phenylene vinylene) Light-Emitting Diode", Physical Review B., vol. 65, 085210-1-085210-8.

(Continued)

*Primary Examiner* — Jack Berman
*Assistant Examiner* — Meenakshi S Sahu
(74) *Attorney, Agent, or Firm* — Woodcock Washburn LLP

(57) ABSTRACT

In one embodiment, a method for creating a pattern in a layer of an organic electronic device that includes selectively irradiating a portion of the layer is provided, and devices and sub-assemblies made by the same.

16 Claims, 5 Drawing Sheets

U.S. PATENT DOCUMENTS

| | | |
|---|---|---|
| 6,265,319 B1 | 7/2001 | Jang |
| 6,303,238 B1 | 10/2001 | Thompson et al. ............ 428/690 |
| 6,303,942 B1 | 10/2001 | Farmer, II ........................ 257/30 |
| 6,303,943 B1 | 10/2001 | Yu et al. ............................ 257/40 |
| 6,316,786 B1 | 11/2001 | Mueller et al. .................... 257/40 |
| 6,320,311 B2 | 11/2001 | Nakaya et al. ................. 313/506 |
| 6,353,280 B1 | 3/2002 | Shibata et al. ................. 313/292 |
| 6,358,631 B1 | 3/2002 | Forrest et al. |
| 6,369,495 B2 | 4/2002 | Codama et al. ................ 313/292 |
| 6,432,741 B1 | 8/2002 | Mueller et al. ................... 438/99 |
| 6,448,710 B1 | 9/2002 | Asai et al. ....................... 313/504 |
| 6,475,836 B1 | 11/2002 | Suzawa et al. |
| 6,483,099 B1 | 11/2002 | Yu et al. ........................ 250/214.1 |
| 6,515,417 B1 | 2/2003 | Duggal et al. ................. 315/506 |
| 6,525,467 B1 | 2/2003 | Eida et al. ....................... 313/506 |
| 6,533,631 B2 | 3/2003 | Asai et al. ......................... 445/24 |
| 6,541,790 B1 | 4/2003 | Pichler ............................. 257/40 |
| 6,541,919 B1 | 4/2003 | Roach et al. ................ 315/169.3 |
| 6,555,957 B1 | 4/2003 | Nomura et al. ............... 313/495 |
| 6,560,398 B1 | 5/2003 | Roach et al. ................... 385/147 |
| 6,566,156 B1 | 5/2003 | Sturm et al. ..................... 438/35 |
| 6,592,933 B2 | 7/2003 | Himeshima et al. ............. 427/66 |
| 6,617,786 B1 | 9/2003 | Centofante ..................... 313/512 |
| 6,656,611 B2 | 12/2003 | Tai et al. ......................... 428/690 |
| 6,664,564 B2 | 12/2003 | Peng ................................ 257/40 |
| 6,696,370 B2 | 2/2004 | Jackson ........................... 438/780 |
| 6,881,598 B2 | 4/2005 | Pichler ............................. 438/22 |
| 2001/0019782 A1 | 9/2001 | Igarashi et al. ................ 428/690 |
| 2002/0055210 A1 | 5/2002 | Peng |
| 2002/0072139 A1 | 6/2002 | Kashiwabara |
| 2003/0030061 A1 | 2/2003 | Peng ................................ 257/79 |
| 2003/0064324 A1 | 4/2003 | Wang et al. |
| 2003/0094607 A1 | 5/2003 | Guenther et al. |
| 2003/0222861 A1* | 12/2003 | Nishikawa et al. ............ 345/204 |
| 2003/0224547 A1 | 12/2003 | Lee et al. ......................... 438/22 |
| 2004/0096697 A1 | 5/2004 | Tai et al. ......................... 428/690 |
| 2004/0192830 A1* | 9/2004 | Zhang ............................ 524/547 |
| 2007/0249088 A1 | 10/2007 | Ohmori et al. |
| 2009/0317563 A1 | 12/2009 | Ohmori et al. |

FOREIGN PATENT DOCUMENTS

| | | |
|---|---|---|
| DE | 201 06 283 U1 | 8/2001 |
| EP | 0615256 A2 | 9/1994 |
| EP | 1 191 612 A2 | 3/2002 |
| EP | 1835513 A1 | 9/2007 |
| EP | 1 191 614 A2 | 5/2009 |
| JP | 03250583 | 11/1991 |
| JP | 2061110566 | 4/2001 |
| JP | 2002008859 | 11/2002 |
| JP | 2003 017251 | 1/2003 |
| JP | A-2004-327829 | 11/2004 |
| JP | A-2006-185673 | 7/2006 |
| JP | A-2006-185674 | 7/2006 |
| JP | A-2006-185675 | 7/2006 |
| JP | A-2006-318775 | 11/2006 |
| JP | 63 228789 | 9/2008 |
| KR | 2001073038 | 7/2001 |
| KR | 20020000204 | 1/2002 |
| KR | 2002016127 | 3/2002 |
| WO | WO 96/19792 A2 | 6/1996 |
| WO | WO 97/33296 A1 | 9/1997 |
| WO | WO 00/70655 | 11/2000 |
| WO | WO 01/39287 A1 | 5/2001 |
| WO | WO 01/41512 A1 | 6/2001 |
| WO | WO 02/02714 A2 | 1/2002 |
| WO | WO 02/15645 A1 | 2/2002 |
| WO | WO 2006/070801 | 7/2006 |
| WO | WO 2006/078427 | 7/2006 |

OTHER PUBLICATIONS

Gustafsson, G. et al., "Flexible Light-Emitting Diodes made from Soluble Conducting Polymer", Nature, 1992, 357, 477-479.

O'Brien, D.F. et al., "Electrophosphoresence from a Doped Polymer Light Emitting Diode", Synthetic Metals, 2001, 116(1-3), 379-383.

Othmer, K., Encyclopedia of Chemical Technology, 1996, 18(4$^{th}$ Ed), 837-860.

Sze, S.M. (Editor), 9.2.4 Sputter Deposition, VLSI Technology, 358, 1983, McGraw-Hill Book Company.

Wolf, Stanley and Tauber, Richard N., Silicon Processing for the VLSI ERA, 1986, vol. 1: Process Technology, 546, 568-569, 581-582.

* cited by examiner

DEVICE PATTERNING USING IRRADIATION

CROSS-REFERENCE TO RELATED APPLICATIONS

This application is the National Stage of International Application No. PCT/US2005/047280, filed Dec. 29, 2005, which claims the benefit of U.S. Provisional Application Nos. 60/640,600, filed Dec. 30, 2004 and 60/694,394, filed Jun. 27, 2005, the disclosures of which are incorporated herein by reference in their entireties.

FIELD

This disclosure relates generally to device patterning techniques and more specifically to patterning techniques involving irradiation of a layer of an electronic device.

BACKGROUND

Organic electronic devices convert electrical energy into radiation, detect signals through electronic processes, convert radiation into electrical energy, or include one or more organic semiconductor layers. For example, organic light-emitting diodes (OLEDs) are a type of organic electronic device that comprises particular organic films (photoactive organic films) that emit photons when an electric current is applied, in a process called electroluminescence. The emission of light from the photoactive organic films in organic electronic devices may be used in electrical displays and microelectronic devices. For example, in some applications of organic electronic device displays, the organic electronic device is used as a segmented display or icon. Thus, rather than generating an image from a set of pixels that can be selectively activated to generate a variety of images, the same image is displayed by the organic electronic device, either repeatedly or continuously. As a result, the image is created during the organic electronic device's fabrication process.

Conventional photo-resist patterning techniques are able to create an image typically having acceptable edge definition, but these techniques are best suited for devices having a rigid substrate. Devices having flexible substrates, such as flexible organic electronic device displays, do not respond well to conventional photo-resist patterning techniques.

Thus, what is needed is a method of patterning an organic electronic device that overcomes the above shortcomings and drawbacks.

SUMMARY

In one embodiment, a method for creating a pattern in a layer of an organic electronic device that includes selectively irradiating a portion of the layer is provided, and devices and sub-assemblies made by the same.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1A:
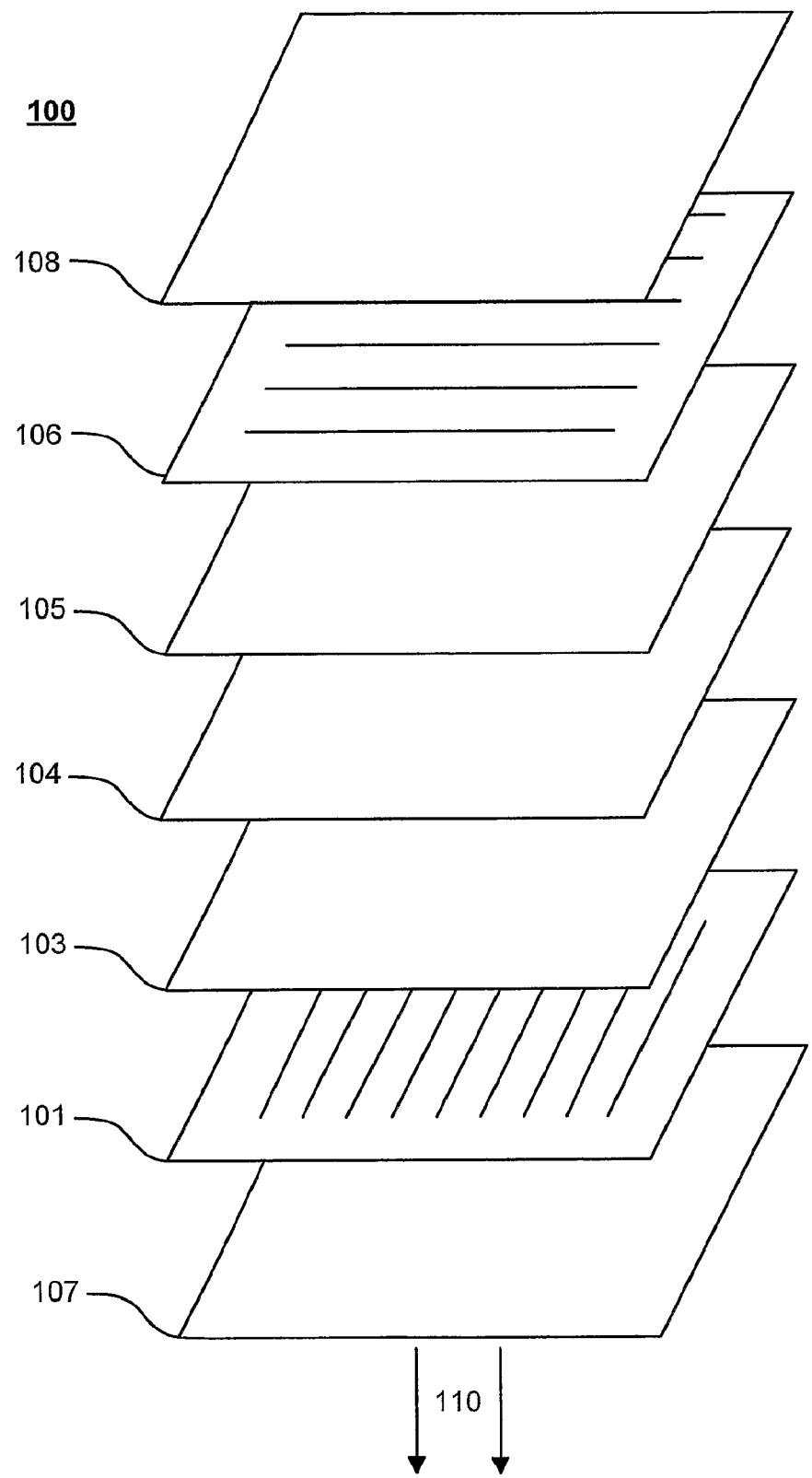
FIG. 1A is a diagram illustrating an exploded view of an exemplary OLED in which aspects of the invention may be implemented.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

In one embodiment, a method for creating a pattern in a layer of an organic electronic device is provided. The method includes selectively irradiating a portion of the layer.

In one embodiment, the layer is not an active layer.

In one embodiment, a portion of the layer that is not irradiated remains conducting, thereby creating a pattern formed from the conducting and non-conducting portions of the buffer layer.

In one embodiment, the portion of the layer is irradiated with ultraviolet light.

In one embodiment, the method further includes applying a mask to the layer to block the ultraviolet light from a portion of the layer desired to be conducting.

In one embodiment, the method further includes depositing a polymer layer onto the layer, and performing cathode deposition through a mask, wherein the mask surrounds at least one feature desired to be conducting.

In one embodiment, the method further includes depositing a contact and lead line to the polymer layer.

In one embodiment, the atmosphere comprises air.

In one embodiment, a system for creating a pattern in an organic electronic device is provided. The system includes a layer of the organic electronic device and a light source for selectively irradiating a portion of the layer, wherein the selectively irradiated portion becomes non-conducting upon irradiation.

In one embodiment, the light source creates a pattern formed from a conducting portion and the non-conducting portion of the layer.

In one embodiment, the light source is an ultraviolet light source.

In one embodiment, the ultraviolet light source is a laser.

In one embodiment, the ultraviolet light source is an ultraviolet light bulb.

In one embodiment, the system further includes a mask for blocking the irradiation from a portion of the layer desired to be luminescent.

In one embodiment, an organic electronic device is provided. The organic electronic device includes a buffer layer, wherein the buffer layer has a conducting portion and a non-conducting portion, and wherein the non-conducting portion of the buffer layer has been irradiated with ultraviolet light.

In one embodiment, a polymer layer has been deposited onto the buffer layer.

In one embodiment, the buffer layer is (Poly(3,4-ethylenedioxythiophene) poly(styrenesulfonate)).

In one embodiment, a composition including the organic electronic device discussed above is provided.

In one embodiment, An organic electronic device having an active layer including the organic electronic device discussed above is provided.

In one embodiment, An article useful in the manufacture of an organic electronic device, comprising the organic electronic device discussed above is provided.

In one embodiment, compositions are provided comprising the above-described compounds and at least one solvent, processing aid, charge transporting material, or charge blocking material. These compositions can be in any form, including, but not limited to solvents, emulsions, and colloidal dispersions.

Definitions

The use of "a" or "an" are employed to describe elements and components of the invention. This is done merely for convenience and to give a general sense of the invention. This description should be read to include one or at least one and the singular also includes the plural unless it is obvious that it is meant otherwise.

The term "activating," when referring to an electronic component or circuit, is intended to mean providing proper signal(s) to the electronic component or circuit so that the electronic component or circuit is at least partially on or is performing one of its principal functions.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

EXAMPLES

The concepts described herein will be further described in the following examples, which do not limit the scope of the invention described in the claims.

In one embodiment, a device may be an organic electronic device such as, for example, an Organic Light-Emitting Diode (OLED). Portions of the organic electronic device that are desired to be non-conducting may be irradiated. The portion may be irradiated with, for example, ultraviolet (UV) light exposure, electron beam exposure, plasma exposure and the like. In the discussion that follows, an embodiment involving UV light exposure is described for purposes of explanation and clarity; however, it will be appreciated that any of the above-described sources of irradiation may be used in connection with an embodiment.

The portion to be irradiated and therefore rendered non-conducting may be of any size. For example, the portion may be as large as an entire buffer layer, or alternatively, the portion may be as small as a single sub-pixel. In some embodiments, multiple layers could be irradiated.

In one embodiment, irradiation causes a portion of a layer to become weakly or non-conducting, thereby rendering it effectively incapable of supporting light emission. In contrast, a non-irradiated portion of the layer emits, or in other embodiments allows a charge to pass through it, thus allowing light to form the desired pattern. Thus, portions of the buffer layer that are exposed to UV light may negatively form a pattern of light (portions not irradiated will emit or allow other layers to emit).

Conducting polymer devices, such as organic electronic devices, include, but are not limited to, (1) devices that convert electrical energy into radiation (e.g., a light-emitting diode, light emitting diode display, or diode laser), (2) devices that detect signals through electronics processes (e.g., photodetectors, photoconducting cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers, e.g., a transistor or diode. Persons of skill in the art should recognize that other organic electronic devices may be elaborated and that additional classes of such devices may arise in the future that may benefit from the present invention. All such devices are contemplated hereby.

Thus, while embodiments of the present invention may be used in connection with any conducting polymer device, it will be appreciated that the discussion herein focuses on organic electronic devices for purposes of explanation and clarity. Turning now to FIG. 1A, an exploded view of an exemplary organic electronic device in which aspects of the invention may be implemented is illustrated. In FIG. 1A, organic electronic device 100 comprises anode layer 101, cathode layer 106 and photoactive layer 104 that is disposed between anode layer 101 and cathode layer 106. Adjacent to anode layer 101 may be a buffer layer 103 comprising hole transport material. Adjacent to cathode layer 106 may be electron transport layer 105 comprising an electron transport material. Electron transport layer 105 itself may be comprised of one or more layers. For example, electron transport layer 105 may include an electron transport layer and a layer formed from a low work function material. The electron transport layer may be formed from, for example, BAlq3, Alq3 or the like. The low work function layer may be formed from, for example, calcium, barium, lithium fluoride, etc.

Depending upon the application of device 100, photoactive layer 104 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Kirk-Othmer, Concise Encyclopedia of Chemical Technology, 4th edition, p. 1537, (1999). Hermetic package 108 serves to protect device 100, and in particular photoactive layer 104 and cathode layer 106, and may be fabricated from any material suitable for such a purpose.

Other layers in device 100 can be made of any materials which are known to be useful in such layers upon consideration of the function to be served by such layers. Anode layer 101 comprises an electrode that is effective for injecting positive charge carriers. It can be made of, for example, materials containing or comprising metal, mixed metals, alloy, metal oxides or mixed-metal oxide. Anode layer 101 may include polymer. Suitable metals include the Group 11 metals, the metals in Groups 4, 5, and 6, and the Group 8 10 transition metals. If anode 101 is to be light-transmitting, mixed-metal oxides of Groups 12, 13 and 14 metals, such as indium-tin-oxide (ITO), are generally used. Anode 101 may also comprise an organic material, especially a conducting polymer such as polyaniline, including exemplary materials as described in "Flexible light-emitting diodes made from soluble conducting polymer," Nature, vol. 357, pp. 477-479 (Jun. 11, 1992). It will be appreciated that anodes 101 may be deposited onto substrate 107 as will be discussed below in connection with FIG. 3. When the electrodes of anode layer 101 and cathode layer 106 are energized, light 110 is emitted from device 100. Accordingly, at least one of the anode 101 and cathode 106 should be at least partially transparent to allow the generated light to be observed. In addition, substrate 107, should also be at least partially transparent for the same reason.

Examples of hole transport materials, e.g., for buffer layer 103 have been summarized for example, in Kirk Othmer, Encyclopedia of Chemical Technology, Fourth Ed., vol. 18, p. 837-860, 1996, by Y. Wang. Both hole transporting "small" molecules as well as oligomers and polymers may be used in various embodiments of the invention. Hole transporting molecules include, but are not limited to: N,N' diphenyl-N, N'-bis(3-methylphenyl)-[1,1'-biphenyl]-4,4'-diamine (TPD), 1,1bis[(di-4-tolylamino) phenyl]cyclohexane (TAPC), N,N' bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), a-phenyl 4-N,N-diphenylaminostyrene (TPS), p (diethylamino) benzaldehyde diphenylhydrazone (DEH), triphenylamine (TPA), bis[4 (N,N-diethylamino)-2-methylphenyl](4-methylphenyl)methane (MPMP), 1 phenyl-3-[p-(diethylamino) styryl]-5-[p-(diethylamino)phenyl]pyrazoline (PPR or DEASP), 1,2trans-bis(9H-carbazol-9-yl)cyclobutane (DCZB), N,N,N',N' tetrakis(4-methylphenyl)-(1,1'-biphenyl)-4,4'-diamine (TTB), and porphyrinic compounds, such as copper phthalocyanine. Useful hole transporting polymers include, but are not limited to, polyvinylcarbazole, (phenylmethyl)polysilane, and polyaniline. Conducting polymers are useful as a class. It is also possible to obtain hole transporting polymers by doping hole transporting moieties, such as those mentioned above, into polymers such as polystyrenes and polycarbonates.

Any organic electroluminescent (EL) material can be used as a photoactive material, e.g., in photoactive layer 104. Such materials include, but are not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometallated iridium and platinum electroluminescent compounds. Examples of conjugated polymers include, but are not limited to poly(phenylenevinylenes), polyfluorenes, poly(spirobifluorenes), polythiophenes, poly (p-phenylenes), copolymers thereof, and mixtures thereof.

In one embodiment of the devices of the invention, photoactive material can be an organometallic complex. In another embodiment, the photoactive material is a cyclometallated complex of iridium or platinum. Other useful photoactive materials may be employed as well. Complexes of Iridium with phenylpyridine, phenylquinoline, or phenylpyrimidin ligands have been disclosed as electroluminescent compounds in Petrov et al., Published PCT Application WO 02/02714. Other organometallic complexes have been described in, for example, published applications US 2001/0019782, EP 1191612, WO 02/15645 and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. (2001), 116 (1-3), 379-383, and Campbell et al., in Phys. Rev. B, Vol. 65 085210.

Examples of electron transport materials which can be used, for example, in electron transport layer 105, cathode layer 106 or otherwise include compounds of embodiments of the invention. Such layers can optionally contain a polymer. Other suitable materials include metal chelated oxinoid compounds, such as tris(8-hydroxyquinolato)aluminum (Alq3); and azole compounds such as 2 (4-biphenylyl)-5-(4-t-butylphenyl)-1,3,4-oxadiazole (PB D) and 3 (4-biphenylyl)-4-phenyl-5-(4-t-butylphenyl)-1,2,4-triazole (TAZ); phenanthrolines such as 4,7-diphenyl-1,10-phenanthroline (DPA) and 2,9-dimethyl-4,7-diphenyl-1,10-phenanthroline (DDPA); and mixtures thereof.

Cathode layer 107 comprises an electrode that is effective for injecting electrons or negative charge carriers. Cathode 107 may be any metal or nonmetal having a lower work function than anode 101. Exemplary materials for cathode 107 can include alkali metals of Group, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing and other compounds, such as LiF and Li2O, may also be deposited between an organic layer and the cathode layer to lower the operating voltage of the system.

It is known to have other useful layers in organic electronic devices. For example, there can be a layer (not shown) between anode 101 and buffer layer 103 to facilitate positive charge transport and/or band-gap matching of the layers, or to function as a protective layer. Other layers that are known in the art or otherwise may be used. In addition, any of the above-described layers may comprise two or more sub-layers or may form a laminar structure. Alternatively, some or all of anode layer 101, buffer layer 103, photoactive layer 104, electron transport layer 105, cathode layer 106, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations and compositional identities will be within the ordinary skill of the routineer.

The devices of this invention can be prepared employing a variety of techniques. These include, by way of non-limiting exemplification, sequentially depositing the individual layers on a suitable substrate 107. Substrates such as glass and polymeric films can be used. Vapor deposition techniques can be used, such as thermal evaporation, chemical vapor deposition, and the like. Alternatively, the organic layers can be applied by liquid deposition using suitable solvents. The liquid can be in the form of solutions, dispersions, or emulsions. Typical liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing, any conventional coating or printing technique, including but not limited to spin-coating, dip-coating, roll-to-roll techniques, ink-jet printing, screen-printing, gravure printing and the like.

The location of the electron-hole recombination zone in device 100, and thus the emission spectrum of device 100, can be affected by the relative thickness of each layer. Thus the thickness of electron-transport layer 105 should be chosen so that the electron-hole recombination zone is in a light-emitting layer. The desired ratio of layer thicknesses will depend on the exact nature of the materials used.

As noted above, organic electronic device 100 discussed in connection with FIG. 1A is merely illustrative, as an organic electronic device may be configured in any manner while remaining consistent with an embodiment of the invention. In some organic electronic devices, called active matrix OLED displays, individual deposits of photoactive organic films may be independently excited by the passage of current, leading to individual pixels of light emission. In other organic electronic devices, called passive matrix OLED displays, deposits of photoactive organic films may be excited by rows and columns of electrical contact layers. If a pattern is desired to be illuminated when a passive matrix OLED is activated, the pattern is created during the organic electronic device's fabrication process. It will be appreciated that the pixels that are used in active matrix OLED displays are also created during the organic electronic device's fabrication process, and therefore the methods and systems disclosed herein are equally applicable to active matrix OLED displays as well.

Figure 1B:
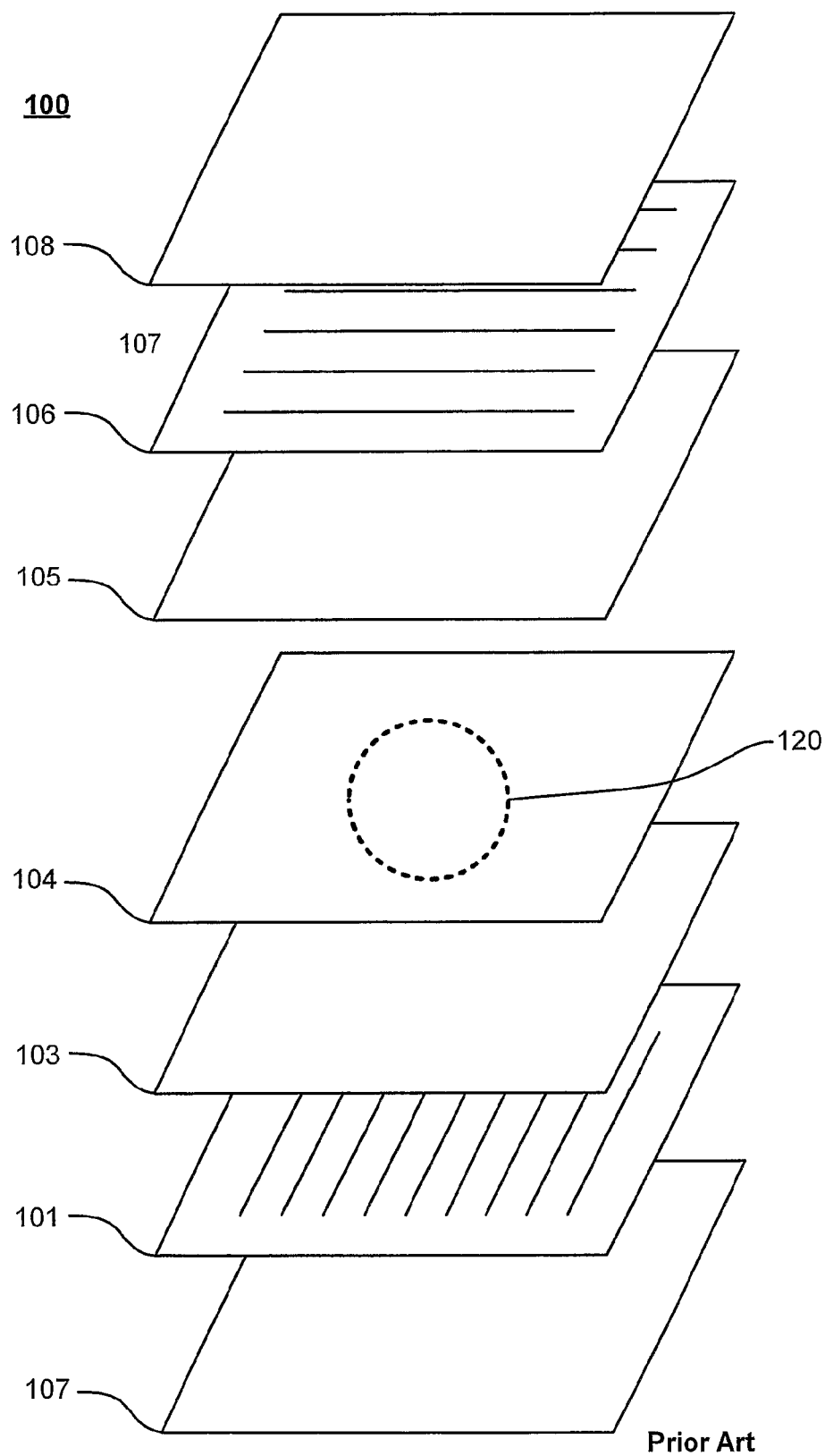
FIG. 1B is a diagram illustrating an exploded view of a conventional device patterning technique.

Accordingly, and turning now to FIG. 1B, a diagram illustrating an exploded view of a conventional device patterning technique is presented. In FIG. 1B, organic electronic device 100 comprises anode layer 101, buffer layer 103, photoactive layer 104, electron transport layer 105 and cathode layer 106, as well as hermetic package 108 and substrate 107, as was discussed above in connection with FIG. 1A. In addition, pattern 120 can be seen to be adjacent to photoactive layer 104. Pattern 120 represents a portion of photoactive layer 104 that is able to become luminescent when the electrodes of anode layer 101 and cathode layer 106 are energized. Thus, the remaining portion of photoactive layer 104 may be wet or dry etched, or otherwise processed, to prevent such luminescence. As a result, pattern 120 will be the only significantly luminescent portion of organic electronic device 100.

As was noted above, in flexible organic electronic device displays such processing of the organic polymer layer is very difficult and does not yield an edge definition that is acceptable for many applications. Accordingly, and turning now to FIG. 1C, a diagram illustrating an exploded view of a device patterning technique according to an embodiment of the invention is provided. It will be appreciated that device 100 comprises anode layer 101, buffer layer 103, photoactive layer 104, electron transport layer 105 and cathode layer 106, as well as hermetic package 108 and substrate 107, as was discussed above in connection with FIG. 1A. In contrast to FIG. 1B, however, device 100 of FIG. 1C has pattern 120 that is formed in buffer layer 103, rather than in photoactive layer 104.

Figure 1C:
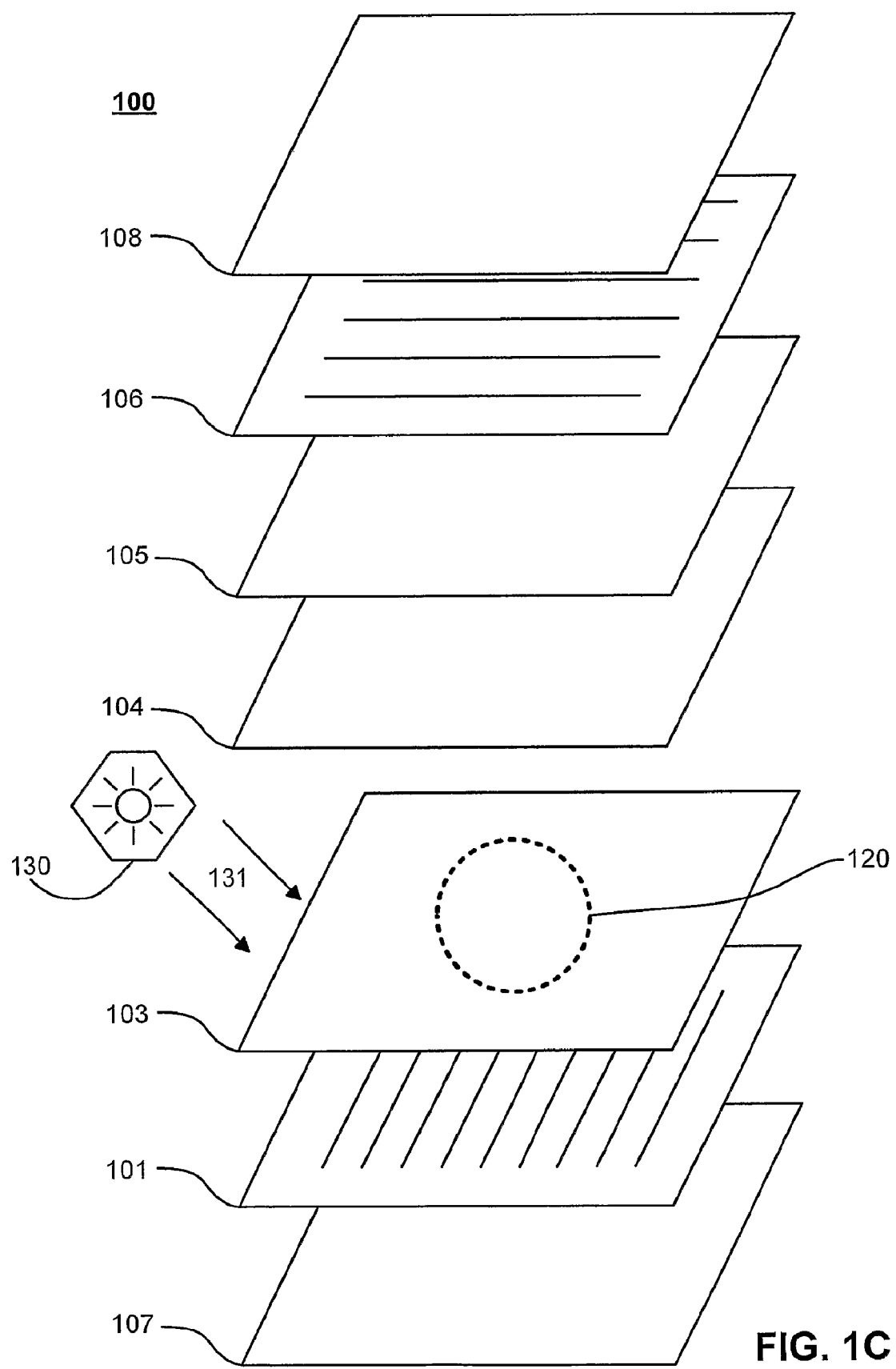
FIG. 1C is a diagram illustrating an exploded view of a device patterning technique according to an embodiment of the invention.

It is well known that ultraviolet (UV) light has a wavelength of 100 nm-400 nm. It has now been found that exposing the buffer layer 103 of an organic electronic device 100 to UV light having a particular wavelength/frequency and intensity while in an atmosphere having certain properties causes buffer layer 103 to become non-conducting. In other words, a buffer layer 103 that is so exposed is unable to be part of a circuit supporting luminescence when the organic electronic device 100 of which the buffer layer 103 is a part is energized. Thus, and as can be seen in FIG. 1C, UV light source 130 emits UV light rays 131 onto buffer layer 103 to cause buffer layer 103 to become non-conducting in the portions exposed to UV light rays 131. As may be appreciated, it is not required that buffer layer 103 become non-conducting throughout its thickness upon being irradiated. Instead, in an embodiment it is sufficient for the buffer layer 103 to become non-conducting or weakly conducting for a sufficient depth near either of its interfaces to render the buffer layer incapable of being part of a circuit that supports luminescence.

It will be appreciated that in an embodiment the photoactive layer 104 may be irradiated by UV light source 130 in addition to or in place of buffer layer 103. In such an embodiment, the photoactive layer 104 may therefore be patterned without the use of photoresist processing. In some embodiments as discussed herein, however, the irradiation of the buffer layer 103 is used because of the buffer layer 103 is typically processed in air, which is an appropriate atmosphere for irradiation, for example. Thus, an embodiment involving the irradiation of the buffer layer 103 may take advantage of a pre-existing fabrication atmosphere.

In addition, it will be appreciated that any type of UV light source 130 may be used in accordance with an embodiment. For example, in one embodiment a D-bulb or H-bulb manufactured by Sartomer Company of Exton, Pa. may be used, while in other embodiments, other types and makes of UV light sources may be used. In addition, the intensity of UV light source 130 may be adjusted any number of factors, such as for example the material of buffer layer 103, the atmosphere present during UV light exposure, desired characteristics of the pattern to be displayed by organic electronic device 100 (e.g., edge definition, etc.), and the like. For example, in one embodiment, an H-bulb operating in an air atmosphere on a (Poly(3,4-ethylenedioxythiophene) poly (styrenesulfonate)) buffer layer 103 may emit UV light at 14 J/cm2 to create a non-conducting portion on buffer layer 103. It will be appreciated that the 14 J/cm2 value is merely illustrative, as any range of UV light intensities may be used according to the above-referenced factors. In addition, it will be appreciated that UV light source 130 may be located at any distance from buffer layer 103 during exposure of buffer layer 103 to UV light rays 131.

It will also be appreciated that a mask (not shown in FIG. 1C for clarity) may be used to block UV light rays 131 from reaching portions of buffer layer 103 that are desired to be luminescent. The optional use of a mask composition is discussed below in connection with FIGS. 2 and 3.

Figure 2:
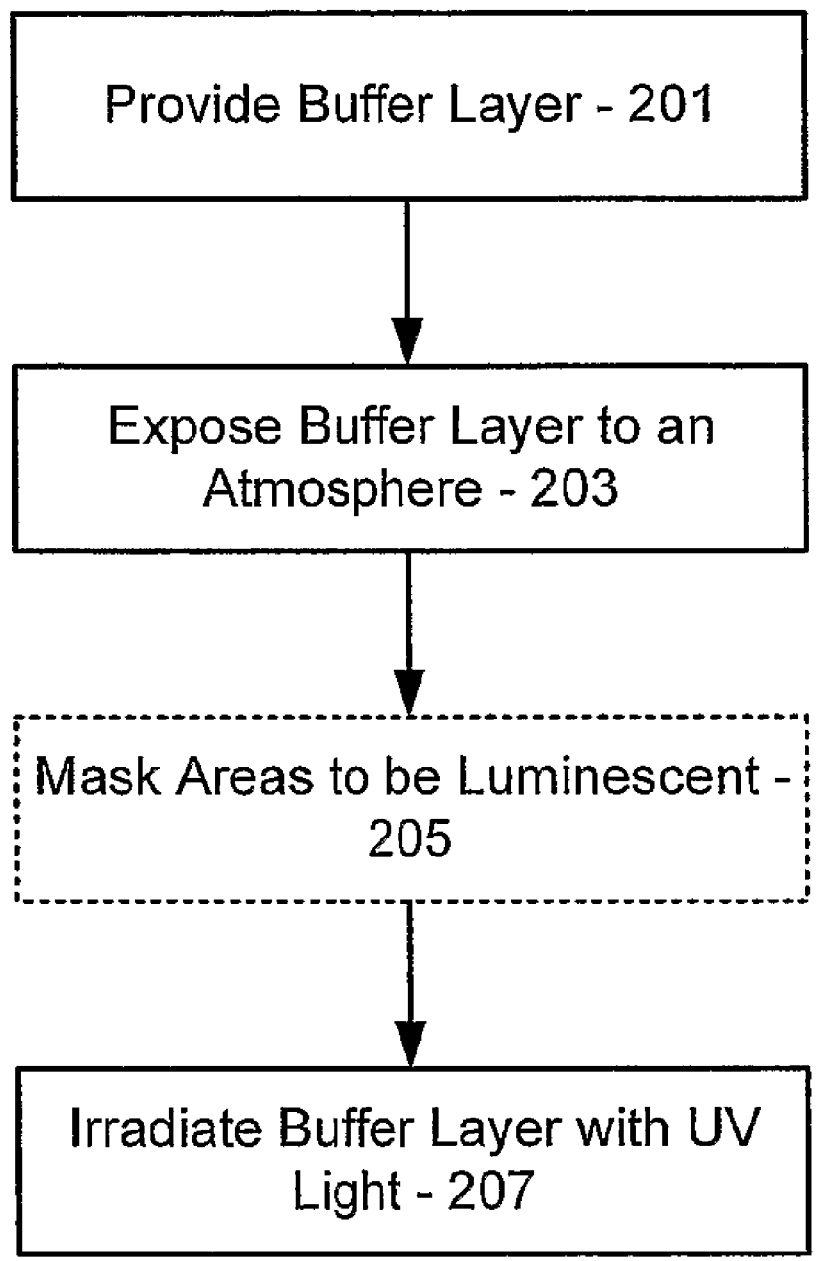
FIG. 2 is a flowchart illustrating a method of patterning a light-emitting device according to an embodiment of the invention.

Turning now to FIG. 2, a flowchart illustrating a method 200 of patterning a light-emitting device according to an embodiment of the invention is provided. It will be appreciated that method 200 of FIG. 2 illustrates the UV light exposure portion of an organic electronic device's fabrication process. Any additional fabrication steps may be used in connection with method 200 while remaining consistent with an embodiment. For example, an organic electronic device that is patterned according to an embodiment may have any number of layers, to include any number of buffer layers that may or may not be patterned according to an embodiment of the invention. Thus, method 200 may be carried out any number of times for a particular organic electronic device.

At step 201, a buffer layer, such as for example buffer layer 103 as discussed above in connection with FIGS. 1A-C, is provided. As was also noted above, the buffer layer may be deposited onto a substrate, such as substrate 107, which was also discussed above in connection with FIGS. 1A-C. Alternatively, the buffer layer may ultimately be adjacent to the substrate, but the buffer layer need not be so located during method 200.

At step 203, the buffer layer is exposed to an atmosphere. As noted above in connection with FIG. 1C, the intensity and/or type of UV light (e.g., the exact wavelength of UV light within the UV light spectrum, etc.) may be adjusted according to the composition of the atmosphere, and any number of additional factors. The atmosphere may be air, humid air, ozone, or the like. While in one embodiment an atmosphere of air has been found to require less UV light intensity for a given buffer layer patterning application than other atmospheres, it should be appreciated that other atmospheres may be used in connection with method 200.

At optional step 205, the portions of the buffer layer to be conducting when the organic electronic device is completed may be masked to block UV light. It will be appreciated that step 205 may be optional because a directed manner of irradiating the buffer layer with UV light may render the mask superfluous. For example, the UV light may be emitted by a laser, which may be able to present a focused, coherent beam of UV light in such a manner so as to only expose the buffer layer to UV radiation at desired locations (i.e., where the beam is focused). In either event, portions of the buffer layer that are to be conducting should not be exposed to UV light during method 200. It will be appreciated that in embodiments that use a mask, the mask may be located at any distance from the buffer layer or the UV light source. Any number of factors, operational or otherwise, may be used to determine the distances.

At step 207, the buffer layer is irradiated with UV light, thereby rendering the buffer layer substantially incapable of becoming conducting when the resulting organic electronic device is energized. As noted above, the intensity of the UV light used in step 207 may be adjusted for the type of material that comprises the buffer layer, the atmosphere in which step 207 takes place, operational considerations, and the like. In addition, the buffer layer may be irradiated with UV light for a predetermined amount of time. In one embodiment, the intensity of the UV light may be adjusted according to, in part or in whole, the amount of time the buffer layer will be exposed to the UV light.

It will be appreciated that step 207 may take place in any number of ways. For example, a buffer layer to be exposed to UV light may be on a conveyer that moves the buffer layer past a stationary UV light source, the UV light source may move while the buffer layer is stationary, or any combination of the above. In an embodiment, the speed of such a conveyor may be adapted to cause the buffer layer to be exposed to the UV light for a predetermined amount of time. It can be seen that method 200 may be integrated into any type of organic electronic device fabrication environment.

Figure 3:
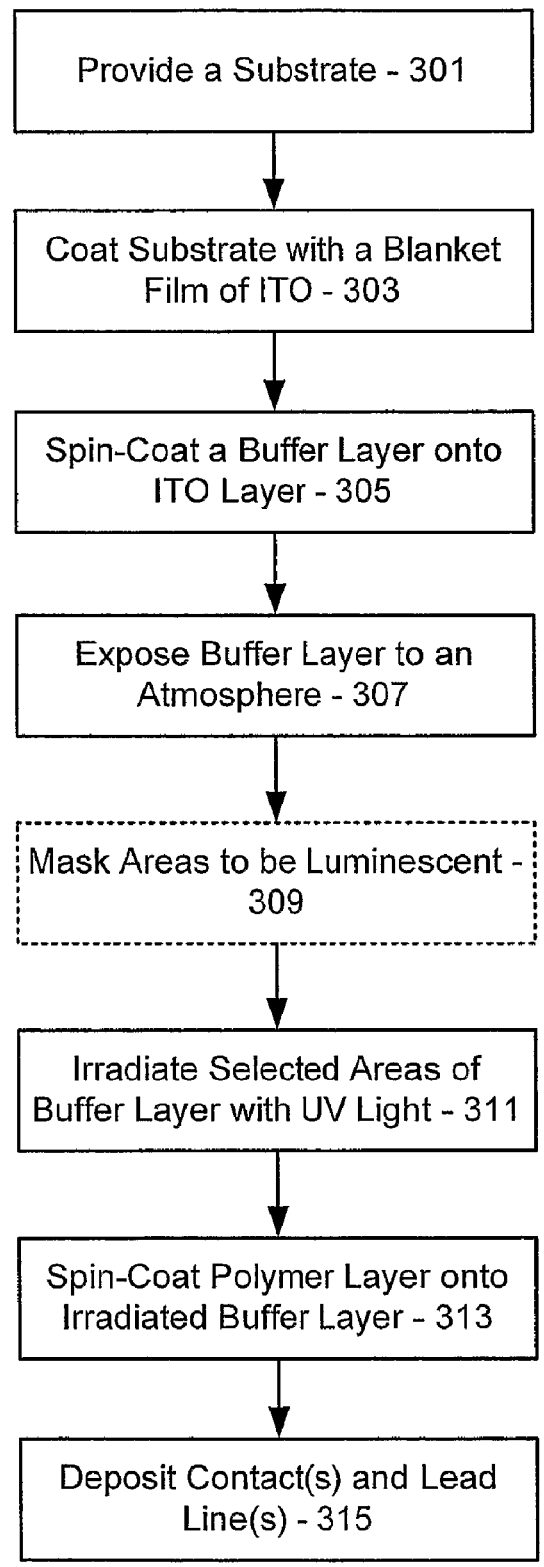
FIG. 3 is a flowchart illustrating a method of patterning a light-emitting device according to an embodiment of the invention.

As noted above, method 200 of FIG. 2 comprises a portion of the fabrication process of an organic electronic device. To further explain and clarify an embodiment, FIG. 3 is a flowchart illustrating a more complete method of patterning a light-emitting device. It will be appreciated that an organic electronic device fabrication process may comprise more or fewer steps than those illustrated in connection with method 300 of FIG. 3. Again, this is because method 300 is presented for purposes of explanation and clarity, and therefore modifications may be made to method 300 while remaining consistent with an embodiment of the invention.

At step 301, a substrate is provided. The substrate may be, for example, a glass or other type of substrate as discussed above in connection with substrate 107 of FIGS. 1A-C. At step 303, the substrate is coated with a blanket film of ITO. As was also noted above, ITO is just one composition that may be used to coat the substrate.

At step 305, a buffer layer is deposited onto the ITO layer. As was discussed above, the buffer layer may be fabricated from (Poly(3,4-ethylenedioxythiophene) poly(styrenesulfonate)) or the like. It will be appreciated that any method may be used to deposit the buffer layer to the ITO layer. For example, spin coating, slot coating or the like may be used in connection with an embodiment. At step 307, the buffer layer is exposed to an atmosphere. As was discussed above in connection with FIG. 2, the atmosphere may be air, ozone, or the like.

At optional step 309, the portions of the buffer layer to be conducting when the organic electronic device is assembled may be masked to block UV light. As was noted above, optional step 309 may be omitted if the means by which the UV light is emitted is selective enough to avoid irradiating portions of the buffer layer that are to remain conducting. For example, in one embodiment a laser with a sufficiently focused beam of light having an appropriate wavelength may be used as the UV light source. In such an embodiment, a mask may not be necessary because UV light may not be directed to portions of the buffer layer that are desired to be conducting. Alternatively, the amount of UV light that is directed to portions of the buffer layer that are desired to be conducting may be below a threshold to cause the buffer layer to become non-conducting. It will be appreciated that UV light exposure to areas that are desired to be conducting, even if below a threshold to render the area non-conducting, may compromise a resulting organic electronic device's contrast ratio and lifetime. An embodiment, therefore, minimizes the exposure of such areas to UV light.

At step 311, portions of the buffer layer that are desired to be substantially non-conducting are irradiated with UV light. In an embodiment, step 311 may be performed in a manner that is consistent with step 207 of FIG. 2, above. At step 313, an organic polymer layer is deposited onto the irradiated buffer layer. Again, any deposition method may be used.

At step 315, contacts and cathode lines (e.g., such as the electrodes that are part of cathode layer 106 as discussed above in connection with FIGS. 1A-C) are deposited. It will be appreciated that in an embodiment contacts and cathode lines may be deposited at the same time. In an alternate embodiment, such deposition the cathode lines may be split up into two or more steps. For example, a plasma etch step may be inserted in between multiple iterations of step 315 to clear the device of polymers everywhere except in the portions where a first cathode line was deposited. In other words, the first cathode deposit may be used as a stencil for the plasma etching process. A 2-step cathode deposit may be employed in case, for example, a thin film encapsulation process needs to be used for encapsulating the device after the cathode line deposition steps. It will also be appreciated that every feature of the organic electronic devise display that is to be luminescent (i.e., conducting) should receive a contact so as to enable the luminescent portion to be energized so as to emit light. Examples of such processes may be found in, for example, commonly-assigned U.S. application Ser. Nos. 10/625,112, filed Jul. 22, 2003, and 10/890,360, filed Jul. 13, 2004. Both applications are entitled "Process for Removing an Organic Layer During Fabrication of an Organic Electronic Device and the Organic Electronic Device Formed by the Process," and are incorporated by reference herein in their entirety. As noted above, method 200 of FIG. 2 comprises a portion of the fabrication process of an organic electronic device. To further explain and clarify an embodiment, FIG. 3 is a flowchart illustrating a more complete method of patterning a light-emitting device. It will be appreciated that an organic electronic device fabrication process may comprise more or fewer steps than those illustrated in connection with method 300 of FIG. 3. Again, this is because method 300 is presented for purposes of explanation and clarity, and therefore modifications may be made to method 300 while remaining consistent with an embodiment of the invention.

At step 301, a substrate is provided. The substrate may be, for example, a glass or other type of substrate as discussed above in connection with substrate 107 of FIGS. 1A-C. At step 303, the substrate is coated with a blanket film of ITO. As was also noted above, ITO is just one composition that may be used to coat the substrate.

At step 305, a buffer layer is deposited onto the ITO layer. As was discussed above, the buffer layer may be fabricated from (Poly(3,4-ethylenedioxythiophene) poly(styrenesulfonate)) or the like. It will be appreciated that any method may be used to deposit the buffer layer to the ITO layer. For example, spin coating, slot coating or the like may be used in connection with an embodiment. At step 307, the buffer layer is exposed to an atmosphere. As was discussed above in connection with FIG. 2, the atmosphere may be air, ozone, or the like.

At optional step 309, the portions of the buffer layer to be conducting when the organic electronic device is assembled may be masked to block UV light. As was noted above, optional step 309 may be omitted if the means by which the UV light is emitted is selective enough to avoid irradiating portions of the buffer layer that are to remain conducting. For example, in one embodiment a laser with a sufficiently focused beam of light having an appropriate wavelength may be used as the UV light source. In such an embodiment, a mask may not be necessary because UV light may not be directed to portions of the buffer layer that are desired to be conducting. Alternatively, the amount of UV light that is directed to portions of the buffer layer that are desired to be conducting may be below a threshold to cause the buffer layer to become non-conducting. It will be appreciated that UV light exposure to areas that are desired to be conducting, even if below a threshold to render the area non-conducting, may compromise a resulting organic electronic device's contrast ratio and lifetime. An embodiment, therefore, minimizes the exposure of such areas to UV light.

At step 311, portions of the buffer layer that are desired to be substantially non-conducting are irradiated with UV light. In an embodiment, step 311 may be performed in a manner that is consistent with step 207 of FIG. 2, above. At step 313, an organic polymer layer is deposited onto the irradiated buffer layer. Again, any deposition method may be used.

At step 315, contacts and cathode lines (e.g., such as the electrodes that are part of cathode layer 106 as discussed above in connection with FIGS. 1A-C) are deposited. It will be appreciated that in an embodiment contacts and cathode lines may be deposited at the same time. In an alternate embodiment, such deposition the cathode lines may be split up into two or more steps. For example, a plasma etch step may be inserted in between multiple iterations of step 315 to clear the device of polymers everywhere except in the portions where a first cathode line was deposited. In other words, the first cathode deposit may be used as a stencil for the plasma etching process. A 2-step cathode deposit may be employed in case, for example, a thin film encapsulation process needs to be used for encapsulating the device after the cathode line deposition steps. It will also be appreciated that every feature of the organic electronic devide display that is to be luminescent (i.e., conducting) should receive a contact so as to enable the luminescent portion to be energized so as to emit light. Examples of such processes may be found in, for example, commonly-assigned U.S. application Ser. Nos. 10/625,112, filed Jul. 22, 2003, and 10/890,360, filed Jul. 13, 2004. Both applications are entitled "Process for Removing an Organic Layer During Fabrication of an Organic Electronic Device and the Organic Electronic Device Formed by the Process," and are incorporated by reference herein in their entirety.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

Further, reference to values stated in ranges include each and every value within that range.

The invention claimed is:

1. A method for creating a pattern in a buffer layer of an organic electronic device, comprising selectively irradiating a portion of the layer to produce a layer wherein said portion of the layer that was irradiated is not light emitting while the portion of the layer that was not irradiated is light emitting and wherein said layer comprises poly(3,4-ethylenedioxythiophene)-poly(styrenesulfonate).

2. The method of claim 1, wherein a portion of the layer that is not irradiated remains conducting, thereby creating a pattern formed from the conducting and non-conducting portions of the buffer layer.

3. The method of claim 1, wherein the portion of the layer is irradiated with ultraviolet light.

4. The method of claim 3, further comprising applying a mask to the layer to block the ultraviolet light from a portion of the layer desired to be conducting.

5. The method of claim 1, further comprising:
depositing a polymer layer onto the layer; and
performing cathode deposition through a mask, wherein the mask surrounds at least one feature desired to be conducting.

6. The method of claim 5, further comprising depositing a contact and lead line to the polymer layer.

7. The method of claim 1, wherein the atmosphere comprises air.

8. A system for creating a pattern in a buffer layer of an organic electronic device, comprising:

a layer of the organic electronic device; said layer comprises poly(3,4-ethylenedioxythiophene)-poly(styrenesulfonate); and a light source for selectively irradiating a portion of the layer, wherein the selectively irradiated portion becomes non-conducting and non-light emitting upon irradiation.

9. The system of claim 8, wherein the light source creates a pattern formed from a conducting portion and the non-conducting portion of the layer.

10. The system of claim 8, wherein the light source is an ultraviolet light source.

11. The system of claim 10, wherein the ultraviolet light source is a laser.

12. The system of claim 10, wherein the ultraviolet light source is an ultraviolet light bulb.

13. The system of claim 8, further comprising a mask for blocking the irradiation from a portion of the layer desired to be luminescent.

14. An organic electronic device, comprising:

a buffer layer, wherein the buffer layer has a conducting portion and a non- conducting portion, and wherein the non-conducting portion of the buffer layer has been irradiated with ultraviolet light, said non-conducting portions being non-light emitting; said buffer layer comprises poly(3,4-ethylenedioxythiophene)-poly(styrenesulfonate).

15. The device of claim 14, wherein a polymer layer has been deposited onto the buffer layer.

16. An organic electronic device having an active layer including the organic electronic device of claim 14.

* * * * *